United States Patent
Chang et al.

(10) Patent No.: US 10,224,910 B1
(45) Date of Patent: Mar. 5, 2019

(54) DC OFFSET CALIBRATION CIRCUIT

(71) Applicant: Realtek Semiconductor Corp., HsinChu (TW)

(72) Inventors: Yi-Shao Chang, Kaohsiung (TW); Ka-Un Chan, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/027,362

(22) Filed: Jul. 4, 2018

(30) Foreign Application Priority Data

Aug. 31, 2017 (TW) .............................. 106129778 A

(51) Int. Cl.
| | | |
|---|---|---|
| H04L 25/03 | (2006.01) | |
| H03K 5/003 | (2006.01) | |
| H03F 3/45 | (2006.01) | |
| H03G 3/00 | (2006.01) | |
| H04L 25/49 | (2006.01) | |
| H03G 3/30 | (2006.01) | |

(52) U.S. Cl.
CPC ............ *H03K 5/003* (2013.01); *H03F 3/45* (2013.01); *H03G 3/001* (2013.01); *H03G 3/3042* (2013.01); *H04L 25/4917* (2013.01); *H03F 2200/375* (2013.01); *H03F 2203/45212* (2013.01)

(58) Field of Classification Search
CPC ...... H03K 5/003; H03G 3/3042; H03G 3/001; H04L 25/4917; H03F 3/45; H03F 2203/45212; H03F 2200/375
USPC .......................................................... 375/316
See application file for complete search history.

(56) References Cited

U.S. PATENT DOCUMENTS

| | | | | |
|---|---|---|---|---|
| 2003/0148749 | A1* | 8/2003 | Saito | .................... H03F 3/45977 455/299 |
| 2007/0237264 | A1 | 10/2007 | Huang | |
| 2008/0024337 | A1* | 1/2008 | Marsili | ..................... H04B 1/30 341/120 |
| 2010/0075624 | A1 | 3/2010 | Shanan | |
| 2012/0194265 | A1* | 8/2012 | Katsube | ............ H03H 11/1252 327/554 |

(Continued)

FOREIGN PATENT DOCUMENTS

CN                105630064 A          6/2016

*Primary Examiner* — Don N Vo
(74) *Attorney, Agent, or Firm* — Winston Hsu

(57) ABSTRACT

A DC offset calibration circuit for calibrating DC offset with multi-level method includes analog DC offset cancellation unit and digital DC offset cancellation unit, wherein analog DC offset cancellation unit includes first amplifier and integrator, first amplifier receives analog signal with DC offset, and transmits to integrator, and integrator transmits first feedback signal to first amplifier to output amplified signal with fixed DC offset, and digital DC offset cancellation unit includes comparator, digital circuit, digital-to-analog converter and second amplifier, where second amplifier receives amplified signal with fixed DC offset and transmits to comparator for determining DC offset value and transmitting to digital circuit, digital circuit generates logical result according to DC offset value and transmits to digital-to-analog converter, and therefore digital-to-analog converter accordingly generates second feedback signal to second amplifier, to calibrate DC offset value on second amplifier.

7 Claims, 2 Drawing Sheets

(56) References Cited

U.S. PATENT DOCUMENTS

| | | | |
|---|---|---|---|
| 2014/0176238 A1* | 6/2014 | Guo | .................... H03F 3/45475 |
| | | | 330/254 |
| 2015/0022268 A1 | 1/2015 | Kao | |
| 2015/0188525 A1 | 7/2015 | Yen | |
| 2016/0173048 A1 | 6/2016 | Waheed | |
| 2018/0234763 A1* | 8/2018 | Ganta | ...................... H04R 3/06 |

* cited by examiner

DC OFFSET CALIBRATION CIRCUIT

BACKGROUND OF THE INVENTION

1. Field of the Invention

The present invention relates to a calibration circuit, and more particularly, to a DC offset calibration circuit with analog and digital calibration methods.

2. Description of the Prior Art

The conventional wireless communication systems primarily adopt direct conversion transceiver structures, which usually accompanies with DC offset issues. DC offset is mainly caused by mixing oscillation signal during mixing process, which leads the signal of back-end circuits to be distorted or the amplifier (filter/amplifier) to be saturated and further degrades overall performance of the wireless communication system.

Currently, digital methods are utilized to eliminate the DC offset of the filter or amplifier. For example, a digital DC offset cancellation method includes steps of determining the DC offset by a comparator stage by stage, generating a determination result by digital circuits, and adjusting the DC offset of the amplifier. The digital DC offset cancellation method has the advantage of fast processing speed, while has the disadvantage that when temperature or input signal varies, the outputted DC offset correspondingly changes. Therefore, the DC offset of the amplifier has to be constantly adjusted according to the changes of received signal. Therefore, the conventional digital DC offset cancellation method has to be improved.

SUMMARY OF THE INVENTION

The present invention discloses a DC offset calibration circuit, for calibrating DC offset with multi-level method, comprising an analog DC offset cancellation unit, comprising an analog integrator and a first amplifier, wherein the first amplifier is utilized for receiving an analog signal with a DC offset, and the analog integrator is utilized for receiving an output signal of the first amplifier and outputting a first feedback signal to the first amplifier, whereby the first amplifier outputs an amplified signal with fixed DC offset; and digital DC offset cancellation unit, coupled to the analog DC offset cancellation unit, for receiving the amplified signal with fixed DC offset from the analog DC offset cancellation unit, and comprising a comparator, a digital circuit, a digital-to-analog converter and a second amplifier, wherein the second amplifier is utilized for receiving the amplified signal with fixed DC offset, the comparator receives an output signal of the second amplifier for determining a DC offset value of the output signal and transmitting the DC offset value of the output signal to the digital circuit, the digital circuit is utilized for generating a logical result according to the DC offset and transmitting the logical result to the digital-to-analog converter, and the digital-to-analog converter is utilized for outputting a corresponding second feedback signal to the second amplifier according to the logical result, to calibrate the DC offset of the second amplifier.

The present invention further discloses a wireless signal transceiver, comprising a signal processing unit, comprising a mixer, for mixing a received high frequency signal with local oscillation frequency and transforming the high frequency signal to an intermediate frequency signal; and a DC offset calibration circuit, for calibrating DC offset of the intermediate frequency signal with multi-level method, comprising an analog DC offset cancellation unit, comprising an analog integrator and a first amplifier, wherein the first amplifier is utilized for receiving an analog signal with a DC offset, and the analog integrator is utilized for receiving an output signal of the first amplifier and outputting a first feedback signal to the first amplifier, whereby the first amplifier outputs an amplified signal with fixed DC offset; and a digital DC offset cancellation unit, coupled to the analog DC offset cancellation unit, for receiving the amplified signal with fixed DC offset from the analog DC offset cancellation unit, and comprising a comparator, a digital circuit, a digital-to-analog converter and a second amplifier, wherein the second amplifier is utilized for receiving the amplified signal with fixed DC offset, the comparator receives an output signal of the second amplifier, for determining a DC offset value of the output signal and outputting the DC offset value of the output signal to the digital circuit, the digital circuit is utilized for generating a logical result according to the DC offset and outputting the logical result to the digital-to-analog converter, and the digital-to-analog converter is utilized for outputting a corresponding second feedback signal to the second amplifier according to the logical result, for calibrating the DC offset of the second amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
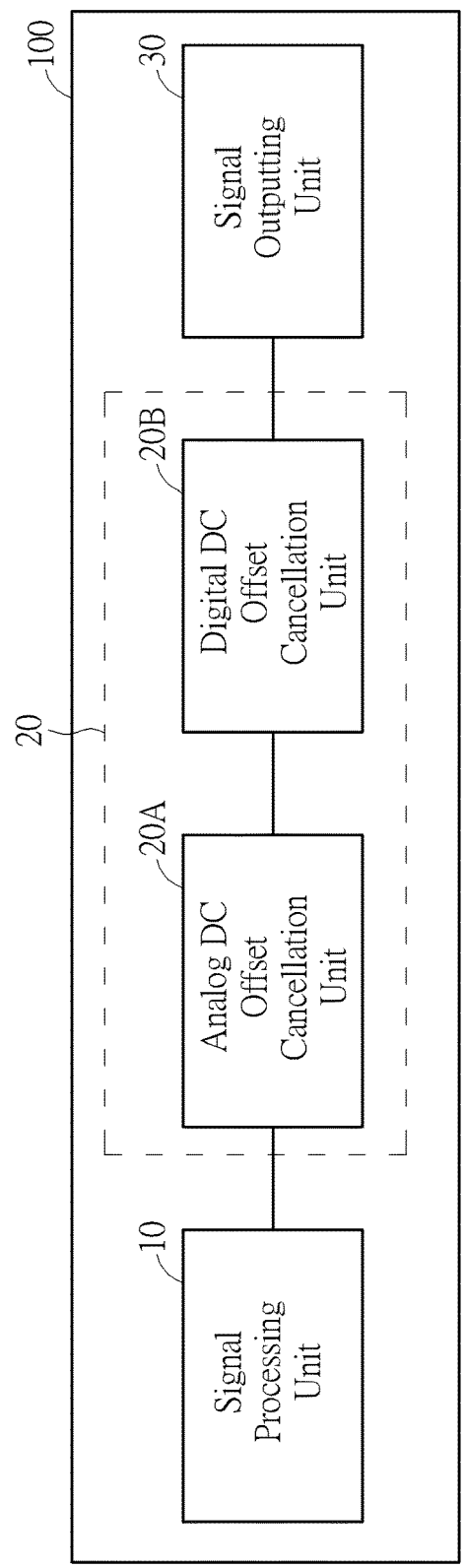
FIG. 1 is a schematic diagram of a transceiver of a wireless communication device according to an embodiment of the present invention.

Please refer to FIG. 1, which is a schematic diagram of a transceiver of a wireless communication device according to an embodiment of the present invention. The DC offset calibration circuit provided by the present invention may be applied to a transceiver, for calibrating the DC offset caused by the circuits of the transceiver, such that the transceiver outputs real signal. As shown in FIG. 1, the transceiver 100 includes a signal processing unit 10, a DC offset calibration circuit 20, which includes an analog DC offset cancellation unit 20A and a digital DC offset cancellation unit 20B, and a signal outputting unit 30. It is noted that the DC offset calibration circuit 20 of the present invention calibrates the DC offset caused by the circuits of the transceiver 100 through multi-level manner. In brief, the analog DC offset cancellation unit 20A of the DC offset calibration circuit 20 provides an analog signal with fixed DC offset to the digital DC offset cancellation unit 20B. Because of the DC offset signal received by the digital DC offset cancellation unit 20B is fixed, the digital DC offset cancellation unit 20B only has to calibrate the DC offset once, to output actual signal to back-end circuits (not shown in the figure) without constant calibration due to different DC offsets of received signals (e.g. signal varied by temperature).

Figure 2:
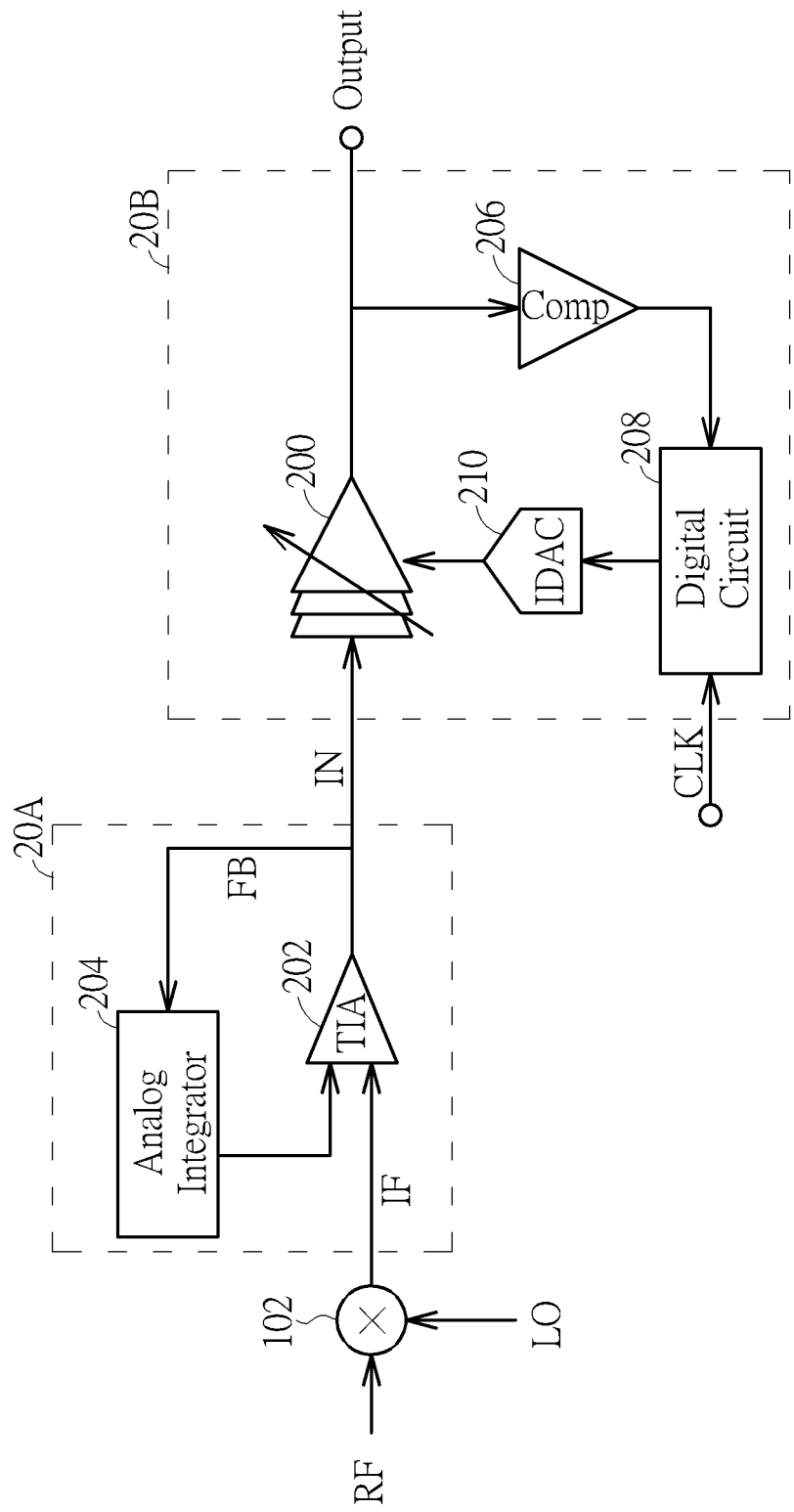
FIG. 2 is a schematic diagram of a DC offset calibration circuit according to an embodiment of the present invention.

More specifically, please refer to FIG. 2, which is a schematic diagram of a DC offset calibration circuit 20 according to an embodiment of the present invention. A high frequency signal RF and a local oscillator frequency LO is mixed by a mixer 102, and the high frequency signal RF is transformed into an intermediate frequency signal IF (the process may be performed by the signal processing unit 10 of FIG. 1) with DC offset. The DC offset is amplified by the amplifier due to signal amplification process, which leads to amplifier saturation or filter distortion. Therefore, the present invention provides the analog DC offset cancellation unit 20A to perform the first level DC offset calibration on the intermediate frequency signal IF. The analog DC offset cancellation unit 20A comprises a transconductance amplifier 202 and an analog integrator 204. In order to eliminate the DC offset of signal output of the transconductance amplifier 202, the analog integrator 204 is disposed between the output end and the input end of the transconductance amplifier 202. The input end of the analog integrator 204 is connected to the output end of the transconductance amplifier 202, for receiving signal output of the transconductance amplifier 202 and extracting the DC offset of the signal output. The DC offset is transmitted to the input end of the transconductance amplifier 202 and deducted with the intermediate frequency signal IF so as to obtain the amplified signal IN with fixed DC offset. In brief, after the intermediate frequency signal IF with DC offset is inputted to the transconductance amplifier 202, the analog integrator 204 outputs a feedback signal FB to the input end of the transconductance amplifier 202 according to the signal output of the transconductance amplifier 202, to eliminate the DC offset of the output signal generated by the transconductance amplifier 202.

As shown in FIG. 2, the amplified signal IN is then inputted to the digital DC offset cancellation unit 20B. The present invention provides the digital DC offset cancellation unit 20B to perform the second level of DC offset calibration. The digital DC offset cancellation unit 20B comprises a comparator 206, a digital circuit 208, a static current generator 210 and a filter/amplifier 200. The comparator 206 is utilized for comparing signal output of the filter/amplifier 200 with a reference level to output a comparison result. The digital circuit 208 performs a binary search operation according to the comparison result generated by the comparator 206, and sequentially sets bits from most significant bit (MSB) to least significant bit (LSB), e.g. sets bit values to 0 or 1. Then, the static current generator 210 adjusts the output current value according to the bit values set by the digital circuit 208, so as to eliminate the DC offset generated by the filter/amplifier 200. Note that, the digital circuit may be realized by a linear search operation or the binary search operation, which is well known in the art and thus is omitted herein.

As abovementioned, the main concept of the present invention is to collect the DC offset information of the transconductance amplifier 202 with the analog integrator 204, wherein the signal output of the transconductance amplifier 202 is feedback to the transconductance amplifier 202 for comparing with the signal output of the mixer 102, so as to eliminate the DC offset accumulated by the transconductance amplifier 202 (namely the first level DC offset calibration). With such manner, the DC offset on receiving end of the filter/amplifier 200 is a fixed value, which does not change with signal variations (e.g. signal variations effected by temperature) of front-end circuits and, equivalently, the DC offset of front-end circuits is locked. Then, the DC offset of the filter/amplifier 200 is eliminated by the comparator 206, the digital circuit 208 and the static current generator 210 (namely the second level DC offset calibration).

In summary, the present invention provides a method to calibrate the DC offset with a combination of analog and digital circuits. The DC offset calibration circuit of the present invention may preserve the characteristics of high calibration speed of digital methods and high stability of the analog methods. Therefore, the DC offset calibration circuit of the present invention does not constantly perform calibration for the entire system while transceiving signals, in which the gain of the high frequency signal constantly changes and results in the DC offset of the output end of the amplifier to be unstable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DC offset calibration circuit, for calibrating DC offset with multi-level method, comprising:
    an analog DC offset cancellation unit, comprising an analog integrator and a first amplifier, wherein the first amplifier is utilized for receiving an analog signal with a DC offset, and the analog integrator is utilized for receiving an output signal of the first amplifier and outputting a first feedback signal to the first amplifier, whereby the first amplifier outputs an amplified signal with fixed DC offset; and
    a digital DC offset cancellation unit, coupled to the analog DC offset cancellation unit, for receiving the amplified signal with fixed DC offset from the analog DC offset cancellation unit, and comprising a comparator, a digital circuit, a digital-to-analog converter and a second amplifier, wherein the second amplifier is utilized for receiving the amplified signal with fixed DC offset, the comparator receives an output signal of the second amplifier for determining a DC offset value of the output signal and transmitting the DC offset value of the output signal to the digital circuit, the digital circuit is utilized for generating a logical result according to the DC offset and transmitting the logical result to the digital-to-analog converter, and the digital-to-analog converter is utilized for outputting a corresponding second feedback signal to the second amplifier according to the logical result, to calibrate the DC offset of the second amplifier.

2. The DC offset calibration circuit of claim 1, wherein the first amplifier is a transconductance amplifier.

3. The DC offset calibration circuit of claim 1, wherein the digital-to-analog converter is a static current generator.

4. The DC offset calibration circuit of claim 1, wherein the analog signal is an intermediate frequency signal after mixing a high frequency signal.

5. A wireless signal transceiver, comprising:
    a signal processing unit, comprising a mixer, for mixing a received high frequency signal with local oscillation frequency and transforming the high frequency signal to an intermediate frequency signal; and
    a DC offset calibration circuit, for calibrating DC offset of the intermediate frequency signal with multi-level method, comprising:
        an analog DC offset cancellation unit, comprising an analog integrator and a first amplifier, wherein the first amplifier is utilized for receiving an analog signal with a DC offset, and the analog integrator is utilized for receiving an output signal of the first amplifier and outputting a first feedback signal to the first amplifier, whereby the first amplifier outputs an amplified signal with fixed DC offset; and a digital DC offset cancellation unit, coupled to the analog DC offset cancellation unit, for receiving the amplified signal with fixed DC offset from the analog DC offset cancellation unit, and comprising a comparator, a digital circuit, a digital-to-analog converter and a second amplifier, wherein the second amplifier is utilized for receiving the amplified signal with fixed DC offset, the comparator receives an output signal of the second amplifier, for determining a DC offset value of the output signal and outputting the DC offset value of the output signal to the digital circuit, the digital circuit is utilized for generating a logical result according to the DC offset and outputting the logical result to the digital-to-analog converter, and the digital-to-analog converter is utilized for outputting a corresponding second feedback signal to the second amplifier according to the logical result, for calibrating the DC offset of the second amplifier.

6. The wireless signal transceiver of claim 5, wherein the first amplifier is a transconductance amplifier.

7. The wireless signal transceiver of claim 5, wherein the digital-to-analog converter is a static current generator.

\* \* \* \* \*